(12) United States Patent  
Kudoh et al.

(10) Patent No.: US 11,993,679 B2  
(45) Date of Patent: May 28, 2024

(54) THERMALLY CONDUCTIVE SHEET

(71) Applicant: SEKISUI POLYMATECH CO., LTD., Saitama (JP)

(72) Inventors: Hiroki Kudoh, Kawaguchi (JP); Taku Sasaki, San Jose, CA (US); Kana Hattori, Nishinomiya (JP); Kazuyuki Yahara, Nagaokakyo (JP); Yasunari Kusaka, Osaka (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 742 days.

(21) Appl. No.: 17/252,508

(22) PCT Filed: Jun. 18, 2019

(86) PCT No.: PCT/JP2019/024112  
§ 371 (c)(1),  
(2) Date: Dec. 15, 2020

(87) PCT Pub. No.: WO2019/244889  
PCT Pub. Date: Dec. 26, 2019

(65) Prior Publication Data  
US 2021/0261737 A1 Aug. 26, 2021

(30) Foreign Application Priority Data

Jun. 22, 2018 (JP) .................... 2018-119377

(51) Int. Cl.  
F28F 21/06 (2006.01)  
C08G 77/06 (2006.01)  
(Continued)

(52) U.S. Cl.  
CPC ............. *C08G 77/18* (2013.01); *C08G 77/06* (2013.01); *C08J 5/18* (2013.01); *C08K 7/06* (2013.01); *H05K 7/2039* (2013.01); *F28F 21/06* (2013.01)

(58) Field of Classification Search  
None  
See application file for complete search history.

(56) References Cited

U.S. PATENT DOCUMENTS

2007/0284366 A1 12/2007 Ohta  
2016/0104657 A1 4/2016 Aramaki et al.  
2018/0230643 A1 8/2018 Kanaya

FOREIGN PATENT DOCUMENTS

CN 105283952 1/2016  
CN 107849803 3/2018  
(Continued)

OTHER PUBLICATIONS

Machine translation of CN 107849803A (Year: 2023).*  
(Continued)

*Primary Examiner* — Alexander S Thomas  
(74) *Attorney, Agent, or Firm* — Wenderoth, Lind & Ponack, L.L.P.

(57) ABSTRACT

A thermally conductive sheet 10 of the present invention comprises a polymer matrix 12 and an anisotropic filler 13, and the anisotropic filler 13 is oriented in a thickness direction. The anisotropic filler 13 is disposed in such a way as to fall down in a proportion of 1 to 45% in the vicinity of surfaces 10A, 10B of the thermally conductive sheet 10. According to the present invention, a thermally conductive sheet capable of sufficiently improving the thermal conductive properties in the thickness direction can be provided.

14 Claims, 4 Drawing Sheets

(51) Int. Cl.
*C08G 77/18* (2006.01)
*C08J 5/18* (2006.01)
*C08K 7/06* (2006.01)
*H05K 7/20* (2006.01)

(56) References Cited

FOREIGN PATENT DOCUMENTS

| | | | | |
|---|---|---|---|---|
| CN | 107849803 A | * | 3/2018 | ............ C08J 5/06 |
| JP | 2002128911 A | * | 5/2002 | ............ H01B 1/24 |
| JP | 2006-335958 | | 12/2006 | |
| JP | 2007-107151 | | 4/2007 | |
| JP | 2010-254766 | | 11/2010 | |
| JP | 4657816 | | 1/2011 | |
| JP | 4791146 | | 7/2011 | |
| JP | 2011-231242 | | 11/2011 | |
| JP | 2014-27144 | | 2/2014 | |
| JP | 2015-73067 | | 4/2015 | |
| JP | 2016-506 | | 1/2016 | |
| JP | 2016-92407 | | 5/2016 | |
| JP | 2017-135137 | | 8/2017 | |
| JP | 2018-14534 | | 1/2018 | |
| JP | 2018-56315 | | 4/2018 | |
| TW | 201430064 | | 8/2014 | |
| WO | 2017/179318 | | 10/2017 | |

OTHER PUBLICATIONS

Machine translation of JP2002128911 (Year: 2023).*
International Search Report (ISR) dated Aug. 27, 2019 in International (PCT) Application No. PCT/JP2019/024112.
Extended European Search Report dated Feb. 14, 2022, in European Patent Application No. 19821774.7.

* cited by examiner

THERMALLY CONDUCTIVE SHEET

TECHNICAL FIELD

The present invention relates to a thermally conductive sheet, and relates to, for example, a thermally conductive sheet to be used by being disposed between a heat-generating element and a heat-dissipating element.

BACKGROUND ART

In electronic devices, such as a computer, an automobile part, and a cellular phone, a heat-dissipating element, such as a heat sink, is generally used for dissipating heat which is generated from a heat-generating element such as a semiconductor element or a mechanical part. It is known that a thermally conductive sheet is disposed between a heat-generating element and a heat-dissipating element for the purpose of enhancing the efficiency of heat transfer to the heat-dissipating element.

A thermally conductive sheet is generally used by being compressed when disposed inside an electronic device, and high flexibility is required in the thermally conductive sheet. Accordingly, a thermally conductive sheet is formed by blending a filler having thermal conductive properties in a polymer matrix having high flexibility, such as rubber or gel. It is widely known that a filler having anisotropy, such as a carbon fiber, is oriented in the thickness direction in a thermally conductive sheet in order to enhance the thermal conductive properties in the thickness direction (see, for example, PTLs 1 and 2). Further, a method for producing a thermally conductive sheet by interposing the thermally conductive sheet between two sheets of polyethylene terephthalate (PET) films is also disclosed (see, for example, PTL 3).

CITATION LIST

Patent Literature

PTL1: JP 2018-056315 A
PTL2: JP 2018-014534 A
PTL3: JP 2011-231242 A

SUMMARY OF INVENTION

Technical Problem

With sophisticated function of electric devices, needs for enhancing the properties of a thermally conductive sheet have also been increased and further enhancement of the thermal conductivity in the thickness direction has been desired in recent years. However, as disclosed in PTLs 1 and 2, there is limitation on enhancing the thermal conductivity only by orienting a filler in the thickness direction, and further improvements have been desired. In addition, it has turned out that a filler on the surface of a thermally conductive sheet are difficult to orient in the thickness direction in the production method such as the one of PTL 3 in some cases.

The present invention has been completed in view of the above problems, and an object of the present invention is to provide a thermally conductive sheet capable of sufficiently improving the thermal conductive properties in the thickness direction.

Solution to Problem

The present inventors have conducted diligent studies to find that by disposing an anisotropic filler on a surface of a sheet, the surface observed with an optical microscope, in such a way as to fall down in a predetermined proportion, the problems can be solved, and thereby completed the present invention. The present invention provides the following [1] to [14].

[1] A thermally conductive sheet comprising:
a polymer matrix; and
an anisotropic filler, the anisotropic filler oriented in a thickness direction,
the anisotropic filler being disposed in such a way as to fall down in a proportion of 1 to 45% on a surface of the thermally conductive sheet, the surface observed with an optical microscope.
[2] The thermally conductive sheet according to [1], wherein the anisotropic filler is not exposed on the surface of the thermally conductive sheet.
[3] The thermally conductive sheet according to [1] or [2], wherein the anisotropic filler is a fiber material.
[4] The thermally conductive sheet according to [3], wherein the fiber material is a carbon fiber.
[5] The thermally conductive sheet according to [3] or [4], wherein the fiber material has an average fiber length of 50 to 500 μm.
[6] The thermally conductive sheet according to any one of [1] to [5], further comprising a non-anisotropic filler.
[7] The thermally conductive sheet according to [6], wherein the non-anisotropic filler is at least one selected from the group consisting of alumina, aluminum, zinc oxide, boron nitride, and aluminum nitride.
[8] The thermally conductive sheet according to [6] or [7], wherein a ratio of a volume filling ratio of the non-anisotropic filler to a volume filling ratio of the anisotropic filler is 2 to 5.
[9] The thermally conductive sheet according to any one of [1] to [8], wherein at least part of the anisotropic filler which is disposed in such a way as to fall down on the surface is disposed in such a way as to incline with respect to the surface.
[10] The thermally conductive sheet according to any one of [1] to [9], wherein the polymer matrix is addition reaction-curable type silicone.
[11] The thermally conductive sheet according to any one of [1] to [10], wherein the thermally conductive sheet has a thickness of 0.1 to 5 mm.
[12] The thermally conductive sheet according to any one of [1] to [11], wherein the thermally conductive sheet has a thermal conductivity in a thickness direction of 6 w/m·K or more.
[13] The thermally conductive sheet according to [4], wherein the carbon fiber is covered with an insulating layer.
[14] The thermally conductive sheet according to [13], wherein the insulating layer comprises silicon dioxide.

Advantageous Effects of Invention

According to the present invention, a thermally conductive sheet capable of sufficiently improving the thermal conductive properties in the thickness direction can be provided.

DESCRIPTION OF EMBODIMENTS

Hereinafter, a thermally conductive sheet according to embodiments of the present invention will be described in detail.

First Embodiment

Figure 1:
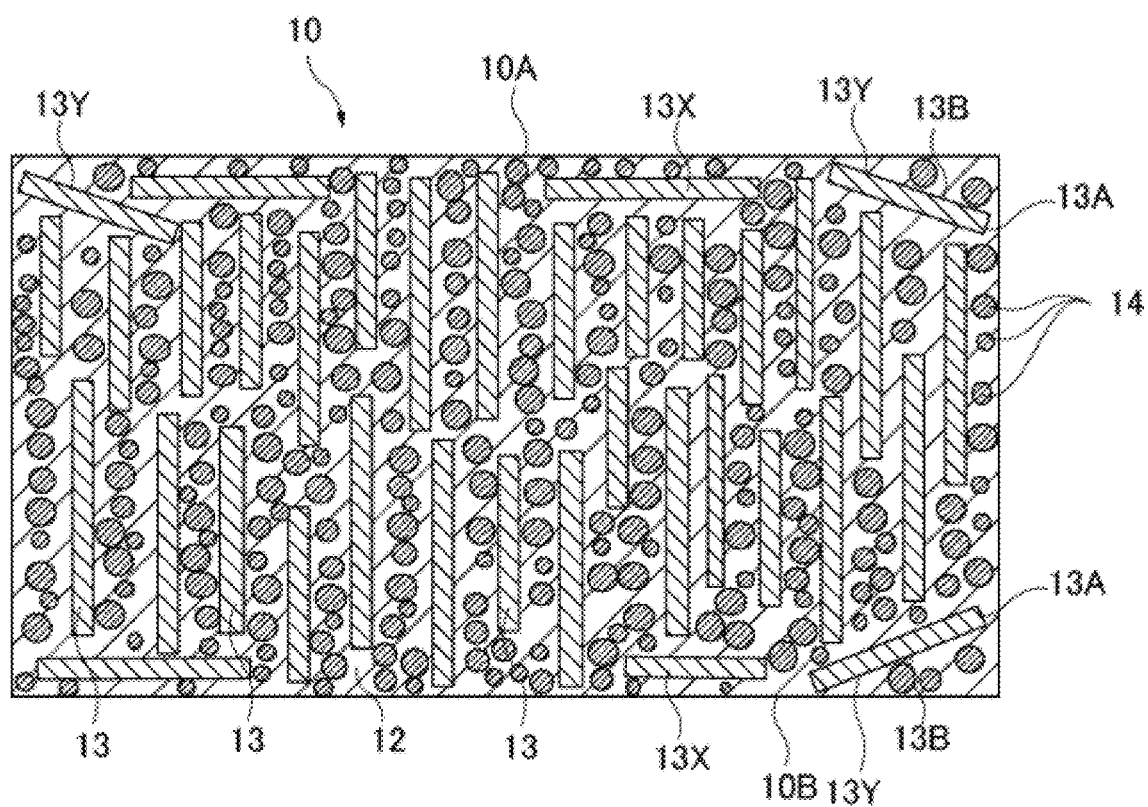
FIG. 1 is a schematic section view showing a thermally conductive sheet of the first embodiment.

FIG. 1 shows a thermally conductive sheet of the first embodiment. In FIG. 1, an example of a case where an anisotropic filler is a fiber material is representatively shown. The thermally conductive sheet 10 according to the first embodiment comprises a polymer matrix 12 and an anisotropic filler 13, and the anisotropic filler 13 is oriented in the thickness direction. Part of the anisotropic filler 13 is disposed in such a way as to fall down in the vicinity of the surface of each surface 10A, 10B of the thermally conductive sheet 10. The vicinity of the surface means a surface which will be mentioned later and is observed with an optical microscope.

In the thermally conductive sheet 10 of the present embodiment, the anisotropic filler 13 is difficult to dispose on the surfaces 10A, 10B, as described in the production method, which will be mentioned later. Therefore, the anisotropic filler 13 does not exist on the surfaces 10A, 10B, or if the anisotropic filler 13 exists, the amount thereof is small and is sufficiently smaller than the proportion of the existence of the anisotropic filler 13 at, for example, the central position in the thickness direction. Thereby, the anisotropic filler 13 is in a state of being embedded inside the sheet on the surfaces 10A, 10B and is not exposed on each surface 10A, 10B of the thermally conductive sheet 10. It is to be noted that not being exposed means a state such that the anisotropic filler existing on the surface of a thermally conductive sheet is substantially covered with the polymer matrix 12. In addition, being covered herein is not necessarily limited to that 100% of the anisotropic filler 13 is covered with the polymer matrix 12.

The anisotropic filler 13 in the vicinity of the surface of each surface 10A, 10B is disposed in such a way as to fall down in a proportion of 1 to 45%. In the thermally conductive sheet 10 of the present embodiment, the proportion of the anisotropic filler 13 which is disposed in such a way as to fall down is 1% or more. This is because it is difficult in practical use to adjust the proportion of the anisotropic filler 13 which is disposed in such a way as to fall down to less than 1%. That is, this proportion of the anisotropic filler 13 which is disposed in such a way as to fall down of 1% is considered to be a minimum value of the proportion of the anisotropic filler 13 which is disposed in such a way as to fall down from the relationship with the limit of an increase in the amount of the anisotropic filler 13 which is oriented in the thickness direction near the surface.

In addition, when the proportion of the anisotropic filler 13 which is disposed in such a way as to fall down exceeds 45%, the amount of the anisotropic filler which is oriented in the thickness direction near the surface is made small, making it difficult to improve the thermal conductivity in the thickness direction.

When the anisotropic filler 13 in the vicinity of the surface of each surface 10A, 10B is not exposed on the surface and is disposed in such a way as to fall down in a proportion of 1 to 45% in the vicinity of the surface, the thermally conductive sheet 10 excellent in thermal conductive properties and also having adhesiveness is thereby made.

The proportion of the anisotropic filler which is disposed in such a way as to fall down is preferably 1 to 25%, more preferably 1 to 10%, and still more preferably 1 to 5% from the viewpoint of enhancing the thermal conductivity in the thickness direction.

The proportion of the anisotropic filler which is disposed in such a way as to fall down in the vicinity of the surface can be calculated by determining the proportion of the number of the anisotropic fillers disposed in such a way as to fall down to the total number of the anisotropic fillers observed in an observation image observed with an optical microscope. By observing the surface of the thermally conductive sheet 10 using an optical microscope under the condition which will be mentioned later, the anisotropic filler which is not exposed on the surface of the thermally conductive sheet 10 and exists in the vicinity of the surface can be observed.

The anisotropic filler 13 disposed in such a way as to fall down herein is a filler fallen down in such an extent that a portion other than an end surface 13A of the anisotropic filler 13 in the observation image is substantially observed in the observation image. The extent of being substantially observed means that the portion other than the end surface 13A is observed in an area (projected area) twice that of the end surface 13A or more. Accordingly, when the anisotropic filler 13 is a fiber material, a fiber material with an outer peripheral surface 13B of the fiber material having an area twice that of the end surface 13A of the fiber material or more in an observation image is regarded as the anisotropic filler disposed in such a way as to fall down.

With respect to an image-analyzing method, the observation image may be observed visually. In addition, the analysis method is not limited as long as the proportion of the number of the anisotropic fillers disposed in such a way as to fall down can be calculated by the above-described standard, and calculation may be conducted using image processing software. For example, visualization may be conducted through processing using general-purpose image processing software (for example, "WINROOF" manufactured by Mitani Corporation).

The observation of the surface of a sheet with an optical microscope is conducted with a digital microscope VHX1000 (manufactured by KEYENCE CORPORATION) at a magnification of 200 in an environment of an illuminance of 2000 lx measured using an illuminometer based on JIS Z9110.

The anisotropic filler 13 disposed in such a way as to fall down in the vicinity of the surface of each surface 10A, 10B may be disposed in such a way as to lie down on each surface 10A, 10B in the vicinity of the surfaces 10A, 10B of the thermally conductive sheet, or may be disposed in such a way as to incline with respect to each surface 10A, 10B in the vicinity of the surfaces 10A, 10B. In addition, the anisotropic filler 13 disposed in such a way as to fall down preferably has an inclination angle with respect to the thickness direction of about 45 to about 90°. When the inclination angle made with respect to the thickness direction exceeds 90°, the supplementary angle is defined as the inclination angle.

The anisotropic filler 13 which is disposed in such a way as to lie down in the vicinity of the surface of the thermally conductive sheet is an anisotropic filler which is substantially disposed along the surface 10A (or 10 B). Such an anisotropic filler is shown as an anisotropic filler 13X in FIG. 1.

In addition, the anisotropic filler which inclines with respect to the surface is an anisotropic filler which inclines in such a way that one end surface 13A of the anisotropic filler 13 separates from the surface 10A (or 10B). Such an anisotropic filler is shown as an anisotropic filler 13Y in FIG. 1.

The anisotropic filler 13 disposed in such a way as to fall down in the vicinity of each surface 10A, 10B preferably comprises the anisotropic filler 13Y which is disposed in such a way as to incline with respect to the surface. The anisotropic filler 13Y which is disposed in such a way as to incline easily comes into contact with the anisotropic filler 13 which is oriented in the thickness direction, making it easy to improve the thermal conductive properties in the thickness direction.

In the present embodiment, the thermally conductive sheet 10 further comprises a non-anisotropic filler 14. The thermally conductive sheet 10, when further comprising the non-anisotropic filler 14, makes the thermal conductive properties further better.

<Polymer Matrix>

The polymer matrix 12 which is used in the thermally conductive sheet 10 is a polymer compound, such as an elastomer or a rubber, and a product formed by curing a polymer composition (curable polymer composition) in a liquid form, the polymer composition comprising a mixed system such as the one comprising a main agent and a curing agent, may preferably be used. For example, the curable polymer composition may be a composition comprising an uncrosslinked rubber and a crosslinking agent, or a composition comprising: a monomer, a prepolymer, or the like; and a curing agent or the like. The curing reaction may be cold curing or heat curing.

Examples of the polymer matrix which is formed from the curable polymer composition include silicone rubber. In the case of silicone rubber, addition reaction-curable type silicone is preferably used as the polymer matrix (curable polymer composition). More specifically, a curable polymer composition comprising alkenyl group-containing organopolysiloxane and hydrogen organopolysiloxane may be used as the curable polymer composition.

Various synthetic rubbers other than the above-described rubber can be used as the rubber, and specific examples thereof include acrylic rubber, nitrile rubber, isoprene rubber, urethane rubber, ethylene propylene rubber, styrene/butadiene rubber, butadiene rubber, fluororubber, and butyl rubber. When any of these rubbers is used, the synthetic rubber may be crosslinked or left uncrosslinked (that is, uncured) in the thermally conductive sheet 10.

When the synthetic rubber is crosslinked (that is, cured), the polymer matrix may be, as described above, a product obtained by curing a curable polymer composition comprising: an uncrosslinked rubber comprising any of these synthetic rubbers; and a crosslinking agent.

As the elastomer, a thermoplastic elastomer, such as a polyester-based thermoplastic elastomer or a polyurethane-based thermoplastic elastomer, or a heat-curable type elastomer which is formed by curing a polymer composition in a liquid form of a mixed system comprising a main agent and a curing agent can be used. Examples of the elastomer include a polyurethane-based elastomer which is formed by curing a polymer composition comprising: a polymer having a hydroxy group; and isocyanate.

Among those described above, silicone rubber, or particularly addition reaction-curable type silicone is preferably used from the viewpoint that, for example, the polymer matrix after curing is particularly flexible and filling properties of a thermally conductive filler are good.

The polymer composition for forming the polymer matrix may be a polymer composition comprising a single substance of a polymer compound, or may be a polymer composition comprising a polymer compound and a plasticizer. The plasticizer is suitably used when a synthetic rubber is used, and when the plasticizer is contained, the flexibility of the uncrosslinked polymer matrix can thereby be enhanced.

The plasticizer having compatibility with the polymer compound is used, and specifically, the plasticizer is preferably an ester-based plasticizer or silicone oil. Specific examples of the ester-based plasticizer include a phthalic acid ester, an adipic acid ester, a trimellitic acid ester, a phosphoric acid ester, a sebacic acid ester, an azelaic acid ester, a maleic acid ester, and a benzoic acid ester. Examples of the silicone oil include polydimethylsiloxane.

The content of the plasticizer to the polymer compound is preferably 20/80 to 60/40, and more preferably 30/70 to 55/45 in terms of a mass ratio of plasticizer/polymer compound. Setting the mass ratio of plasticizer/polymer compound to 60/40 or less makes it easy to retain the filler by the polymer compound. Setting the mass ratio to 20/80 or more makes the flexibility of the polymer matrix sufficient.

The content of the polymer matrix, when expressed by a filling ratio on a volume basis (volume filling ratio), is preferably 20 to 50% by volume, and more preferably 25 to 45% by volume based on the total amount of the thermally conductive sheet.

(Additive)

In the thermally conductive sheet 10, various additives may further be blended in the polymer matrix 12 in a range where the function as the thermally conductive sheet 10 is not impaired. Examples of the additive include at least one or more selected from a dispersant, a coupling agent, a pressure-sensitive adhesive, a fire retardant, an antioxidant, a coloring agent, an anti-settling agent, and the like. When the curable polymer composition is subjected to crosslinking, curing, or the like, as described above, a crosslinking accelerator, a curing accelerator, or the like that accelerates crosslinking or curing may be blended as an additive.

<Anisotropic Filler>

The anisotropic filler 13 which is blended in the polymer matrix 12 is a filler having anisotropy in the shape and is a filler that can be oriented. The anisotropic filler 13 is a heat-conducting filler. Examples of the anisotropic filler 13 include a fiber material and a flake-like material. The anisotropic filler 13 is a filler having a high aspect ratio and is specifically a filler having an aspect ratio of exceeding 2, and the aspect ratio is preferably 5 or more. Setting the aspect ratio to larger than 2 makes it easy to orient the anisotropic filler 13 in the thickness direction, so that the thermal conductive properties of the thermally conductive sheet 10 are enhanced easily.

The upper limit of the aspect ratio is not particularly limited, but is 100 in practical use.

The aspect ratio refers to a ratio of the length in the major axis direction to the length in the minor axis direction of the anisotropic filler 13, and means fiber length/diameter of fiber in a fiber material, and length in major axis direction of flake-like material/thickness in a flake-like material.

The anisotropic filler 13 is preferably a fiber material from the viewpoint of enhancing the thermal conductive properties and from the viewpoint of easily disposing the anisotropic filler 13 in such a way as to fall down on the surfaces 10A, 10B.

The content of the anisotropic filler 13 in the thermally conductive sheet is preferably 30 to 300 parts by mass, and more preferably 50 to 270 parts by mass based on 100 parts by mass of the polymer matrix. The content of the anisotropic filler 13, when expressed by a filling ratio on a volume basis (volume filling ratio), is preferably 5 to 35% by volume, and more preferably 8 to 30% by volume based on the total amount of the thermally conductive sheet.

Setting the content of the anisotropic filler 13 to 30 parts by mass or more makes it easy to enhance the thermal conductive properties, and setting the content to 300 parts by mass or less easily makes the viscosity of the mixed composition, which will be mentioned later, proper, thereby making the orientation of the anisotropic filler 13 good.

When the anisotropic filler 13 is a fiber material, the average fiber length is preferably 50 to 500 μm, and more preferably 70 to 350 μm. When the average fiber length is set to 50 μm or more, the anisotropic fillers come into contact properly inside the thermally conductive sheet 10, so that heat transmission paths are secured. In addition, when the average fiber length of the anisotropic filler 13 is long, the anisotropic filler is easily disposed in such a way as to fall down in the vicinity of the surface, but by the particular production method which will be mentioned later, the anisotropic filler can be oriented in a high proportion in the thickness direction also in the vicinity of the surface.

On the other hand, when the average fiber length is set to 500 μm or less, the bulk of the anisotropic filler is made low, so that the anisotropic filler can be made highly filled in the polymer matrix.

The above-described average fiber length can be calculated by observing the anisotropic filler with a microscope. More specifically, the fiber lengths of arbitrary 50 anisotropic fillers are measured using, for example, an electron microscope or an optical microscope, and the average value (arithmetical mean value) can be adopted as the average fiber length.

The average fiber length of the fiber material is preferably shorter than the thickness of the thermally conductive sheet 10. When the average fiber length is shorter than the thickness, the fiber material is thereby made unlikely to protrude from the surfaces 10A, 10B of the thermally conductive sheet 10.

When the anisotropic filler 13 is a flake-like material, the average particle diameter is preferably 10 to 400 μm, and more preferably 15 to 200 μm. The average particle diameter is particularly preferably 15 to 130 μm. Setting the average particle diameter to 10 μm or more makes it easy for the anisotropic fillers 13 to come into contact in the thermally conductive sheet 10, so that heat transmission paths are secured. In addition, the anisotropic filler 13 is easily disposed in such a way as to fall down on the surface of the thermally conductive sheet 10, but by the particular production method which will be mentioned later, the anisotropic filler can be oriented in a high proportion in the thickness direction also in the vicinity of the surface, making the thermal conductive properties of the thermally conductive sheet 10 good. On the other hand, when the average particle diameter is set to 400 μm or less, the bulk of the thermally conductive sheet 10 is made low, enabling the anisotropic filler 13 to be highly filled in the polymer matrix 12.

The average particle diameter of the flake-like material can be calculated by observing the anisotropic filler with a microscope and assuming the major axis as the diameter. More specifically, the major axes of arbitrary 50 anisotropic fillers are measured using, for example, an electron microscope or an optical microscope, and the average value (arithmetical mean value) can be adopted as the average particle diameter.

A known material having thermal conductive properties may be used as the anisotropic filler 13, but as will be mentioned later, the anisotropic filler 13 preferably has diamagnetism in such a way that the anisotropic filler can be oriented by a magnetic field.

Specific examples of the anisotropic filler 13 include a carbon-based material represented by a carbon fiber or a flake-like carbon powder, a metal material represented by a metal fiber, a metal oxide, boron nitride, a metal nitride, a metal carbide, and a metal hydroxide. A carbon-based material among these has a small specific gravity and good dispersibility into the polymer matrix 12 and is therefore preferable, and, among others, the anisotropic filler is more preferably a graphitized carbon material having a high thermal conductivity. A graphitized carbon material, when having graphite planes uniformly facing a predetermined direction, has diamagnetism. In addition, boron nitride or the like, when having crystal planes uniformly facing in a predetermined direction, also has diamagnetism. Further, the anisotropic filler 13 is particularly preferably a carbon fiber.

The anisotropic filler 13 has a thermal conductivity of, though not limited to, generally 60 W/m·K or more, and preferably 400 W/m·K or more along a direction of having anisotropy (that is, major axis direction). The anisotropic filler 13 has a thermal conductivity of, for example, 2000 W/m·K or less although the upper limit is not particularly limited. The method of measuring the thermal conductivity is a laser flash method.

The anisotropic filler 13 may be used singly, or two or more anisotropic fillers 13 may be used together. For example, at least two anisotropic fillers 13 each having a different average particle diameter or average fiber length may be used as the anisotropic filler 13. It is considered that when the anisotropic fillers each having a different size are used, a smaller anisotropic filler gets in between relatively larger anisotropic fillers, and thereby the anisotropic fillers can be filled up to high density in the polymer matrix and heat-conducting efficiency can be enhanced.

The carbon fiber which is used as the anisotropic filler 13 is preferably a graphitized carbon fiber. The flake-like carbon powder is preferably a flake-like graphite powder. Among these, the anisotropic filler 13 is more preferably a graphitized carbon fiber.

A graphitized carbon fiber has a high thermal conductivity in its fiber axis direction because crystal planes of graphite run in the fiber axis direction. Therefore, by allowing fiber axis directions of the graphitized carbon fiber to face uniformly in a predetermined direction, the thermal conductivity in a particular direction can be enhanced. The flake-like graphite powder has a high thermal conductivity in its in-plane direction because crystal planes of graphite run in the in-plane direction of the flake plane. Therefore, by allowing flake planes of the flake-like graphite powder to face uniformly in a predetermined direction, the thermal conductivity in a particular direction can be enhanced. The graphitized carbon fiber and the flake-like graphite powder each having a high degree of graphitization are preferable.

As the above-described graphitized carbon materials, such as the graphitized carbon fiber and the flake-like graphite powder, products obtained by graphitizing the following raw materials can be used. Examples thereof include a condensed polycyclic hydrocarbon compound, such as naphthalene, and a condensed heterocyclic compound, such as PAN (polyacrylonitrile) or pitch, and graphitized mesophase pitch having a high degree of graphitization, polyimide, or polybenzazole in particular is preferably used. For example, by using mesophase pitch, the pitch is oriented in the fiber axis direction due to its anisotropy in the spinning step which will be mentioned later, so that a graphitized carbon fiber having excellent thermal conductive properties in the fiber axis direction can be obtained.

The aspect of using the mesophase pitch in the graphitized carbon fiber is not particularly limited as long as spinning can be conducted, and the mesophase pitch may be used singly, or may be used in combination with another raw material. However, the mesophase pitch is most preferably used singly, that is a graphitized carbon fiber having a content of mesophase pitch of 100% is most preferable from the viewpoint of enhancement in thermal conductive properties; spinnability; and stability in product quality.

The graphitized carbon fiber obtained such that treatments of spinning, infusibilization, and carbonization are conducted in sequence, and pulverization or cutting is conducted to a predetermined particle diameter, and thereafter graphitization is conducted, or the graphitized carbon fiber such that carbonization is conducted, pulverization or cutting is then conducted, and thereafter graphitization is conducted can be used. When pulverization or cutting is conducted before graphitization, a condensation polymerization and a cyclization reaction progress easily on a surface newly exposed due to pulverization during the graphitization treatment, and therefore a graphitized carbon fiber having thermal conductive properties further improved by enhancing the degree of graphitization can be obtained. When, on the other hand, pulverization is conducted after graphitizing a spun carbon fiber, the carbon fiber after graphitization is rigid and therefore is easily pulverized, so that a carbon fiber powder having a relatively narrow fiber length distribution can be obtained by brief pulverization.

The average fiber length of the graphitized carbon fiber is preferably 50 to 500 μm, and more preferably 70 to 350 μm, as described above. The aspect ratio of the graphitized carbon fiber exceeds 2, and more preferably 5 or more, as described above. The thermal conductivity of the graphitized carbon fiber is not particularly limited, but the thermal conductivity in the fiber axis direction is preferably 400 W/m·K or more, and more preferably 800 W/m·K or more.

The carbon fiber which is used as the anisotropic filler 13 is preferably covered with an insulating layer.

By using the carbon fiber covered with the insulating layer, the electric insulation of the thermally conductive sheet is improved. The thickness of the insulating layer is not particularly limited, but is preferably 100 to 400 nm, and more preferably 100 to 200 nm. The insulating layer comprises silicon dioxide as a substance that exhibits electric insulation. The insulating layer may be an insulating layer comprising only silicon dioxide, but may further comprise aluminum oxide, boron nitride, silicon nitride, and the like in addition to silicon dioxide.

The anisotropic filler 13 is oriented in the thickness direction as described above, but the major axis direction does not necessarily need to be strictly parallel to the thickness direction, and if the major axis direction inclines somewhat in the thickness direction, the anisotropic filler is assumed to be oriented in the thickness direction. Specifically, an anisotropic filler whose major axis direction inclines with respect to the thickness direction by about less than 20° is assumed to be the anisotropic filler 13 which is oriented in the thickness direction, and when such an anisotropic filler 13 is the majority (for example, exceeding 60%, and preferably exceeding 80% based on the total number of anisotropic fillers) in the thermally conductive sheet 10, the anisotropic filler is oriented in the thickness direction.

<Non-Anisotropic Filler>

The non-anisotropic filler 14 is a thermally conductive filler contained in the thermally conductive sheet 10 separately from the anisotropic filler 13 and is a material which, together with the anisotropic filler 13, imparts thermal conductive properties to the thermally conductive sheet 10. In the present embodiment, by filling the non-anisotropic filler 14, an increase in the viscosity is suppressed, making the dispersibility good in the stage prior to curing into a sheet. In addition, in the anisotropic fillers 13, when, for example, the fiber length is large, it is difficult to increase the contact area between the fillers, but when the non-anisotropic filler 14 fills the space between the anisotropic fillers, heat transfer paths can thereby be formed, so that the thermally conductive sheet 10 having a high thermal conductivity is obtained.

The non-anisotropic filler 14 is a filler whose shape is substantially free of anisotropy, and is a filler such that even in an environment where the anisotropic filler 13 is oriented in a predetermined direction, such as an environment, which will be mentioned later, where lines of magnetic force are generated or shear force is applied, the non-anisotropic filler 14 is not oriented in the predetermined direction.

The non-anisotropic filler 14 has an aspect ratio of 2 or less, and preferably 1.5 or less. In the present embodiment, when the non-anisotropic filler 14 having such a low aspect ratio is contained, the filler having thermal conductive properties is thereby properly interposed in the space between the anisotropic fillers 13, so that the thermally conductive sheet 10 having a high thermal conductivity is obtained. In addition, by setting the aspect ratio to 2 or less, an increase in the viscosity of the mixed composition which will be mentioned later is prevented, enabling the thermally conductive sheet to be highly filled.

Specific examples of the non-anisotropic filler 14 include a metal, a metal oxide, a metal nitride, a metal hydroxide, a carbon material, and an oxide, a nitride, and a carbide other than the metal oxide, the metal nitride, and a metal carbide. Examples of the shape of the non-anisotropic filler 14 include a spherical shape and an indefinite-form powder.

In the non-anisotropic filler 14, examples of the metal include aluminum, copper, and nickel, examples of the metal oxide include aluminum oxide represented by alumina, magnesium oxide, and zinc oxide, and examples of the metal nitride include aluminum nitride. Examples of the metal hydroxide include aluminum hydroxide. Examples of the carbon material include spheroidal graphite. Examples of the oxide, the nitride, and the carbide other than the metal oxide, the metal nitride, and the metal carbide include quartz, boron nitride, and silicon carbide.

The non-anisotropic filler 14 is preferably selected from the group consisting of alumina, aluminum, zinc oxide, boron nitride, and aluminum nitride, and alumina in particular is preferable from the viewpoint of filling properties and thermal conductivity.

As the non-anisotropic filler 14, those described above may be used singly, or two or more of those described above may be used together.

The average particle diameter of the non-anisotropic filler 14 is preferably 0.1 to 50 nm, and more preferably 0.5 to 35 nm. The average particle diameter is particularly preferably 1 to 15 nm. By setting the average particle diameter to 50 nm or less, a defect such as disturbing the orientation of the anisotropic filler 13, or the like is made unlikely to occur. By setting the average particle diameter to 0.1 nm or more, the specific surface area of the non-anisotropic filler 14 is not made larger than needed, making the viscosity of the mixed composition unlikely to increase even when a large amount is blended and making it easy to highly fill the non-anisotropic filler 14.

With respect to the non-anisotropic filler 14, for example, at least two non-anisotropic fillers 14 each having a different average particle diameter may be used as the non-anisotropic filler 14.

The average particle diameter of the non-anisotropic filler 14 can be measured by observation with an electron microscope or the like. More specifically, the particle diameters of arbitrary 50 non-anisotropic fillers are measured using, for example, an electron microscope or an optical microscope, and the average value (arithmetical mean value) can be adopted as the average particle diameter.

The content of the non-anisotropic filler 14 is preferably in a range of 200 to 800 parts by mass, and more preferably in a range of 300 to 700 parts by mass based on 100 parts by mass of the polymer matrix.

The content of the non-anisotropic filler 14, when expressed by a filling ratio on a volume basis (volume filling ratio), is preferably 30 to 60% by volume, and more preferably 40 to 55% by volume based on the total amount of the thermally conductive sheet.

By setting the content of the non-anisotropic filler 14 to 200 parts by mass or more, the amount of the non-anisotropic filler 14 interposed in the space between the anisotropic filler 13 is made sufficient, making the thermal conductive properties good. On the other hand, by setting the content to 800 parts by mass or less, an effect of enhancing the thermal conductive properties corresponding to the content can be obtained, and the heat conduction due to the anisotropic filler 13 is not inhibited by the non-anisotropic filler 14. Further, by setting the content within the range of 300 to 700 parts by mass, the thermal conductive properties of the thermally conductive sheet 10 are made excellent and the viscosity of the mixed composition is made suitable.

The ratio of the volume filling ratio of the non-anisotropic filler 14 to the volume filling ratio of the anisotropic filler 13 is preferably 2 to 5, and more preferably 2 to 3. By setting the range of the ratio of the volume filling ratios to the above-described range, the non-anisotropic filler 14 is filled moderately between the anisotropic fillers 13, so that efficient heat transfer paths can be formed, and therefore the thermal conductive properties of the thermally conductive sheet 10 can be improved.

<Thermally Conductive Sheet>

The thermal conductivity in the thickness direction of the thermally conductive sheet 10 is preferably set to 6 W/m·K or more, more preferably 8 W/m·K or more, and still more preferably 13 W/m·K or more. By setting the thermal conductivity in the thickness direction to these lower limit values or more, the thermal conductive properties in the thickness direction of the thermally conductive sheet 10 can be made excellent. The upper limit is not particularly set, the thermal conductivity in the thickness direction of the thermally conductive sheet 10 is, for example, 50 W/m·K or less. The thermal conductivity is measured by a method in accordance with ASTM D5470-06.

The thermal resistance value in the thickness direction of the sheet of the thermally conductive sheet 10 is preferably less than 3.0° C./W, more preferably 2.5° C./W or less, and still more preferably 2.0° C./W or less. Setting the thermal resistance value to a certain value or less in this way makes it easy for the thermally conductive sheet 10 to transmit heat from a heat-generating element to a heat-dissipating element. The thermal resistance value is more better when it is smaller, but is usually 0.1° C./W or more. The thermal resistance value can be measured by the method described in Examples.

The thickness of the thermally conductive sheet is considered to be used in a range of 0.1 to 5 mm, but does not need to be limited to the thickness range. This is because the thickness of the thermally conductive sheet is appropriately changed according to the shape and intended use of an electronic device on which the thermally conductive sheet is loaded.

The thermally conductive sheet 10 is used inside an electronic device or the like. Specifically, the thermally conductive sheet 10 is interposed between a heat-generating element and a heat-dissipating element, transfers heat generated at the heat-generating element to a heat-dissipating element by heat conduction, and dissipates heat from the heat-dissipating element. Examples of the heat-generating element herein include various electronic parts, such as CPU, a power amplifier, and a power source, which are used inside an electronic device. Examples of the heat-dissipating element include a heat sink, a heat pump, and a metal housing of an electronic device. The thermally conductive sheet 10 is used in such a way that the surfaces 10A, 10B closely adhere to a heat-generating element and a heat-dissipating element, respectively and the thermally conductive sheet is compressed.

<Method for Producing Thermally Conductive Sheet>

The thermally conductive sheet of the present embodiment can be produced by, for example, a method comprising the following steps (A) and (B) although the method is not particularly limited thereto.

Step (A): a step of holding a mixed composition with two sheets of release materials to obtain a laminated body Step (B): a step of orienting an anisotropic filler along a direction to be a thickness direction in the thermally conductive sheet Hereinafter, each step will be described in more detail.

[Step (A)]

The step (A) is a step of holding a mixed composition with two sheets of release materials to obtain a laminated body. The mixed composition comprises: an anisotropic filler; a non-anisotropic filler; and a curable polymer composition to be a raw material for a polymer matrix, and can be obtained by mixing these components. On this occasion, if necessary, various additives, such as a fire retardant, may be blended. Known mixing means, such as, for example, a mixer, a kneading roll, a kneader, or an extrusion molding machine, can be used for mixing. The mixed composition is usually in a slurry form, and an organic solvent may be used in order to adjust the viscosity.

Next, the resultant mixed composition is applied on the release material. A doctor blade method or a die coating method is preferably used from the viewpoint of uniformly applying the mixed composition on the release material. After the mixed composition is applied, the other release material is placed onto the mixed composition.

Subsequently, the mixed composition is compressed in the state of being held between the two sheets of release materials using a pressure press or the like until the mixed composition has a desired thickness, thereby obtaining a laminated body. The amount of the mixed composition to be applied and the compression pressure may appropriately be set in view of the size, thickness, and the like of a resultant thermally conductive sheet.

The release material is not particularly limited, but is preferably a resin release material, and among others, the release material is more preferably a polyethylene terephthalate (PET) film, and still more preferably a PET film release-treated with a fluororesin.

The curable polymer composition in the mixed composition held between the two sheets of release materials easily migrates on the surface sides of the release materials on a priority basis due to the surface tension of the release materials, and conversely, the anisotropic filler is unlikely to be disposed in the vicinity of the release materials. It is considered that the resultant thermally conductive sheet is thereby made such that the anisotropic filler is not exposed on the surfaces.

In the step (A), the anisotropic filler is dispersed randomly in the mixed composition held between the release materials.

[Step B]

The step (B) is a step of orienting the anisotropic filler along a direction to be the thickness direction in the thermally conductive sheet. A production method by magnetic field orientation is preferably applied as the method of orienting the anisotropic filler. In the production method by magnetic field orientation, the laminated body obtained in the step (A) is placed in a magnetic field to orient the anisotropic filler along the magnetic field, and thereafter the curable polymer composition is cured.

Examples of a source for generating lines of magnetic force, the source for applying the lines of magnetic force, in the production method by magnetic field orientation include a superconducting magnet, a permanent magnet, and an electromagnet, and a superconducting magnet is preferable from the viewpoint that a magnetic field with a high magnetic flux density can be generated. The magnetic flux density of the magnetic field which is generated from these sources for generating lines of magnetic force is preferably 1 to 30 tesla. Setting the magnetic flux density to 1 tesla or more enables the above-described anisotropic filler comprising a carbon material and the like to be oriented easily. Setting the magnetic flux density to 30 tesla or less enables practical production.

The viscosity of the mixed composition is preferably set to 450 Pa·s or less and is preferably set to 300 Pa·s or less from the viewpoint of making it easy to adjust the proportion of the anisotropic filler which is disposed in such a way as to fall down in a desired range by applying the production method by magnetic field orientation. The viscosity of the mixed composition is preferably set to 10 Pas or more. Thereby, the anisotropic filler and the non-anisotropic filler are made unlikely to settle. The viscosity refers to viscosity measured using a rotational viscometer (Brookfield viscometer DV-E, Spindle SC4-14) at a rotational speed of 10 rpm at 25° C. However, when an anisotropic filler and a non-anisotropic filler which are unlikely to settle are used, or an additive, such as an anti-settling agent, is combined, the viscosity of the mixed composition may be set to less than 10 Pa·s.

By placing the laminated body in the magnetic field, the anisotropic filler is oriented in the thickness direction, but near the interface between the mixed composition and the release material, that is, at a portion to be the surface of the thermally conductive sheet finally, the anisotropic filler is difficult to orient in the thickness direction in the laminated body due to the existence of the release material, so that there is a tendency that the amount of the anisotropic filler which is disposed in such a way as to fall down is made large. Accordingly, vibration is preferably given to the laminated body from the outside from the viewpoint of allowing the proportion of the anisotropic filler which is disposed in such a way as to fall down to fall within a desired range to improve the thermal conductivity of a resultant thermally conductive sheet. Vibration is given to the anisotropic filler through the curable polymer composition and the non-anisotropic filler. As a result, the anisotropic filler is made easy to orient in a thickness direction, so that the proportion of the anisotropic filler which is disposed in such a way as to fall down can be set to a desired range.

In the present application, by adjusting the time, frequency, acceleration, amplitude, and the like for giving vibration, the strength of the vibration can be changed and the proportion of the anisotropic filler which is disposed in such a way as to fall down can be adjusted. When the vibration which is given is strong, the proportion of the anisotropic filler which is oriented in the thickness direction increases and the proportion of the anisotropic filler which is disposed in such a way as to fall down decreases. Conversely, when the vibration which is given is weak, the proportion of the anisotropic filler which is oriented in the thickness direction decreases and the proportion of the anisotropic filler which is disposed in such a way as to fall down increases.

The vibration may be given simultaneously with the application of the production method by magnetic field orientation, or before and after the production method by magnetic field orientation, but is preferably given simultaneously with the application of the production method by magnetic field orientation from the viewpoint of setting the proportion of the anisotropic filler which is disposed in such a way as to fall down to a desired range. A method of giving the vibration is not particularly limited, and, for example, a vibration apparatus that gives vibration utilizing compressed air, or the like can be used.

The viscosity of the mixed composition is preferably set to 450 Pa·s or less, and is preferably set to 300 Pa·s or less from the viewpoint of setting the proportion of the anisotropic filler which is disposed in such a way as to fall down to a desired range by the production method by magnetic field orientation, and the vibration. By setting the viscosity to a certain value or less in this way, the fluidity is made good, it is made easy to orient the anisotropic filler in the thickness direction by the production method by magnetic field orientation, and the vibration, and a defect such as taking too much time for orientation does not occur. The viscosity of the mixed composition is preferably set to 10 Pa·s or more. Thereby, the anisotropic filler and the non-anisotropic filler are made unlikely to settle.

However, when an anisotropic filler and a non-anisotropic filler which are unlikely to settle, are used, or an additive, such as an anti-settling agent, is combined, the viscosity of the mixed composition may be set to less than 10 Pa·s.

Curing of the curable polymer composition may be conducted by heating, and may be conducted at a temperature of, for example, about 50 to about 150° C. The heating time is, for example, about 10 minutes to about 3 hours.

By conducting curing, the thermally conductive sheet held between two sheets of release materials can be obtained.

In the above description, an aspect such that the anisotropic filler 13 is not exposed on each surface 10A, 10B of the thermally conductive sheet 10 is shown. However, in the present invention, the thermally conductive sheet 10 may be such that the anisotropic filler 13 is exposed on one or both of the above-described surfaces 10A, 10B.

A method other than the above-described production method, for example, a production method by flow orientation, in which shear force is applied to the mixed composition to orient the anisotropic filler, may be applied in order to obtain such a thermally conductive sheet.

However, the thermally conductive sheet 10 such that the anisotropic filler is not exposed on the surface of the thermally conductive sheet is preferable because the thermally conductive sheet 10 can enhance the thermal conductivity in the thickness direction and make the adhesiveness on the surface good, and is excellent in balance of physical properties.

Second Embodiment

Next, a thermally conductive sheet of the second embodiment of the present invention will be described with reference to FIG. 2.

Figure 2:
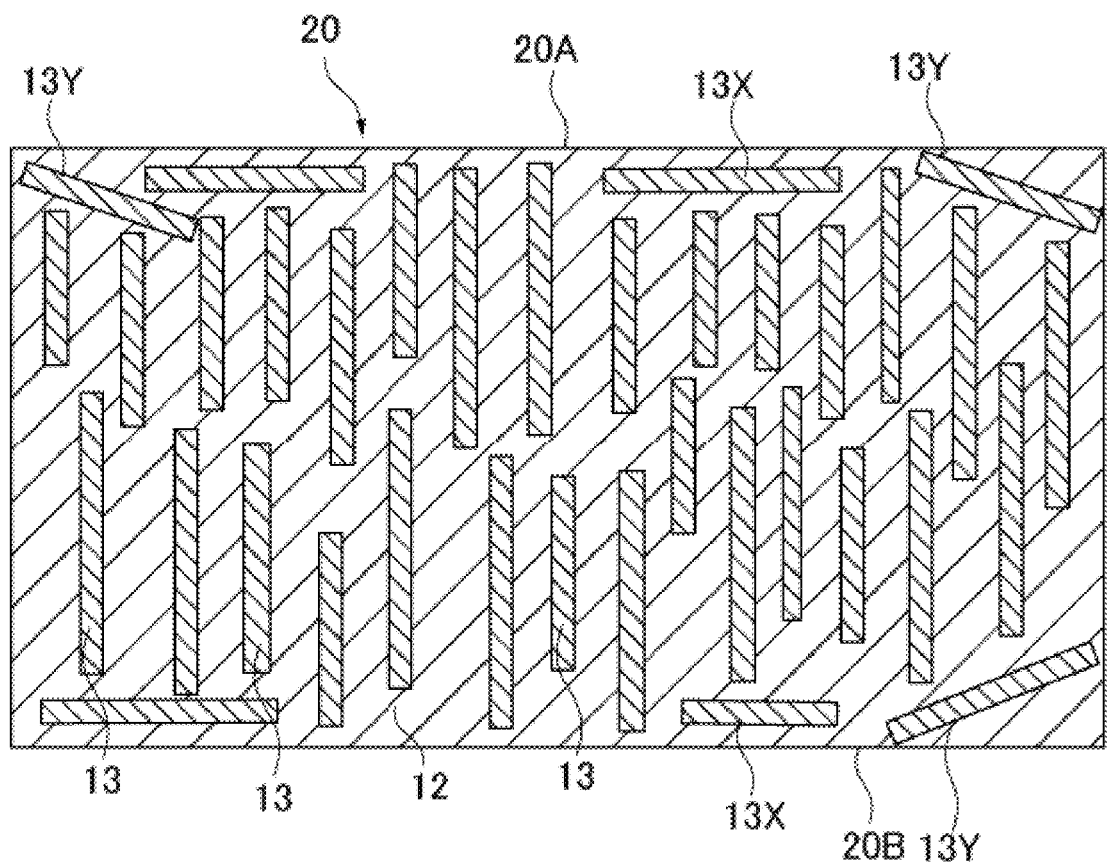
FIG. 2 is a schematic section view showing a thermally conductive sheet of the second embodiment.

In the first embodiment, the non-anisotropic filler 14 is contained as the filler in addition to the anisotropic filler 13 in the thermally conductive sheet 10, but a non-anisotropic filler is not contained in a thermally conductive sheet 20 of the present embodiment, as shown in FIG. 2. That is, in the thermally conductive sheet of the second embodiment, only a carbon fiber, for example, may be used as a filler.

The other constitution of the thermally conductive sheet 20 of the second embodiment is the same as that of the above-described thermally conductive sheet 10 of the first embodiment, except that the non-anisotropic filler is not contained, and therefore the description is omitted.

Also, in the present embodiment, the anisotropic filler 13 on the surface is disposed in such a way that the anisotropic filler falls down in a predetermined proportion in the same manner as in the first embodiment, and the thermal conductive properties in the thickness direction can thereby be improved.

EXAMPLES

Hereinafter, the present invention will be described with reference to Examples in more detail, but the present invention is not limited at all by these Examples.

In the present Examples, the physical properties of the thermally conductive sheets were evaluated by the following methods. [Thermal Conductivity]

The thermal conductivity in the thickness direction of thermally conductive sheets was measured by the method in accordance with ASTM D5470-06. [Proportion of Anisotropic Filler Which Is Disposed in Such a Way as to Fall Down]

An observation image was obtained by observing one surface of each thermally conductive sheet using an optical microscope "Digital Microscope VHX2000" (manufactured by KEYENCE CORPORATION) at a magnification of 200 at an illuminance of 2000 lx based on the illuminance standard of JIS Z9110. In the observation image, the total number of the anisotropic fillers (A) and the number of the anisotropic fillers disposed in such a way as to fall down (B) in the measured region corresponding to 600 to 800 mm×800 to 1000 mm of the thermally conductive sheet were counted visually by the method described in the specification, thereby calculating B/A×100. This operation was repeated 100 times in such a way that each operation was performed at a different measurement region in one surface of the thermally conductive sheet, and the average value was determined to be used as the proportion of the anisotropic filler disposed in such a way as to fall down.

[Thermal Resistance Value]

Figure 3:
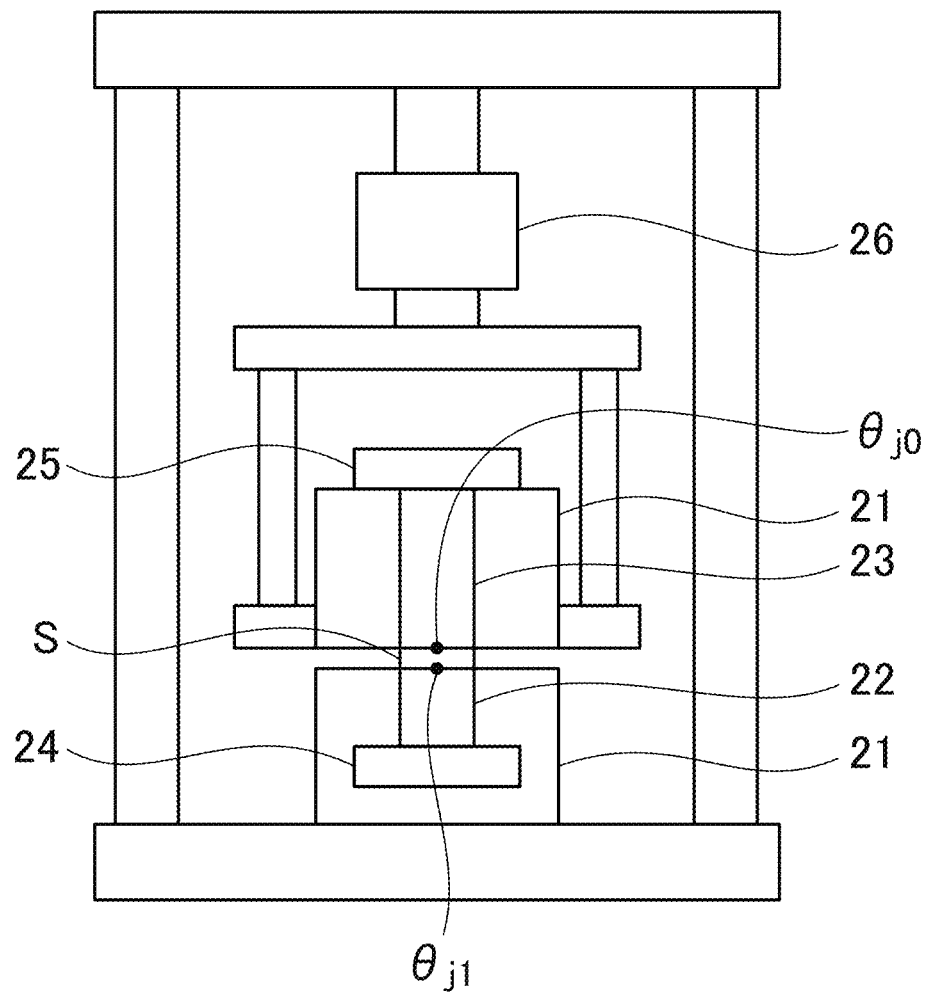
FIG. 3 is an outline diagram of a thermal resistance measuring machine.

The thermal resistance value was measured using a thermal resistance measuring machine as shown in FIG. 3 by the method described below. Specifically, a test piece S having a size of 30 mm×30 mm for the present test was prepared for each sample. Each test piece S was pasted on a copper block 22 such that a measurement face has a size of 25.4 mm×25.4 mm and side faces are covered with a thermal insulator 21, and was held between the copper block and an upper copper block 23, and load was applied with a load cell 26 to set the thickness in such a way as to become 90.0% of the original thickness. The lower copper block 22 is in contact with a heater 24. The upper copper block 23 is covered with the thermal insulator 21 and is connected to a heat sink 25 with a fan. Subsequently, the heater 24 was heated by a calorific value of 25 W, and 10 minutes later when the temperature would reach an almost stationary state, the temperature of the upper copper block 23 ($\theta_{j0}$), the temperature of the lower copper block 22 ($\theta_{j1}$), and the calorific value of the heater (Q) were measured to determine the thermal resistance value of each sample from the following expression (1).

$$\text{Thermal resistance} = (\theta_{j1} - \theta_{j0})/Q \qquad \text{Expression (1)}$$

wherein $\theta_{j1}$ represents the temperature of the lower copper block 22, $\theta_{j0}$ represents the temperature of the upper copper block 23, and Q represents the calorific value.

[Inclined Ball Tack Test]

The thermally conductive sheet produced in each of the Examples and the Comparative Example was adjusted into a size of 20 to 25 mm in width and 50 mm in length to make a test piece. A flat plate (aluminum plate) which is sufficiently larger than the test piece was prepared, and the test piece was pasted to the flat plate in such a way that a face to be an object of the ball tack test is a front surface and a large difference in level did not occur. The flat plate to which the test piece was pasted was set up in such a way as to have an inclination angle of 30°.

Subsequently, a steel ball was set up at the uppermost portion of the test piece, and the time until the steel ball reached the lowermost portion of the test piece (that is, the time required for the steel ball to move by a length of the test piece of 50 mm) was measured to conduct five-grade evaluation of the tackiness as described below. A steel ball whose material is high-carbon chromium bearing steel SUJ2 specified in JIS G 4805, the steel ball having a size of 5.4 to 5.5 g in weight, was used as the steel ball.
(Evaluation)
1: The steel ball passes without stopping.
2: Arrival time is within 1 second, but there is a moment in which movement stops at the time when the test starts or ends.
3: Arrival time exceeds 1 second and is within 5 seconds.
4: Arrival time exceeds 5 seconds and is within 13 seconds.
5: Arrival time exceeds 13 seconds.

Example 1

A mixed composition was obtained by mixing: alkenyl group-containing organopolysiloxane and a hydrogen organopolysiloxane (100 parts by mass in total, volume filling ratio of 30% by volume) as the polymer matrix (polymer composition); 130 parts by mass (volume filling ratio of 18% by volume) of a graphitized carbon fiber (average fiber length of 100 μm, aspect ratio of 10, thermal conductivity of 500 W/m·K) as the anisotropic filler; and 250 parts by mass (volume filling ratio of 20% by volume) of an aluminum oxide powder (spherical, average particle diameter of 10 μm, aspect ratio of 1.0) and 250 parts by mass (volume filling ratio of 32% by volume) of an aluminum hydroxide powder (indefinite form, average particle diameter of 8 μm) as the non-anisotropic filler. The mixed composition had a viscosity of 40 Pa·s.

Next, two sheets of release materials each consisting of a PET film release-treated with a fluororesin was prepared, and after the mixed composition was applied on one release material, the other release material is pressed to the mixed composition to compress the mixed composition until the thickness reached 2 mm, thereby obtaining a laminated body.

Subsequently, a magnetic field of 8 tesla was applied to the laminated body in the thickness direction, and simultaneously, vibration (vibration intensity was "ultra-weak") was added with compressed air from a vibration apparatus, thereby orienting the graphitized carbon fiber in the thickness direction, and the matrix was thereafter cured by heating at 80° C. for 60 minutes, thereby obtaining a thermally conductive sheet held between the two sheets of release materials. Subsequently, the two sheets of release materials were released to obtain a thermally conductive sheet such that the graphitized carbon fiber is not exposed on the surface. Each surface of the thermally conductive sheet had adhesiveness.

Figure 4:
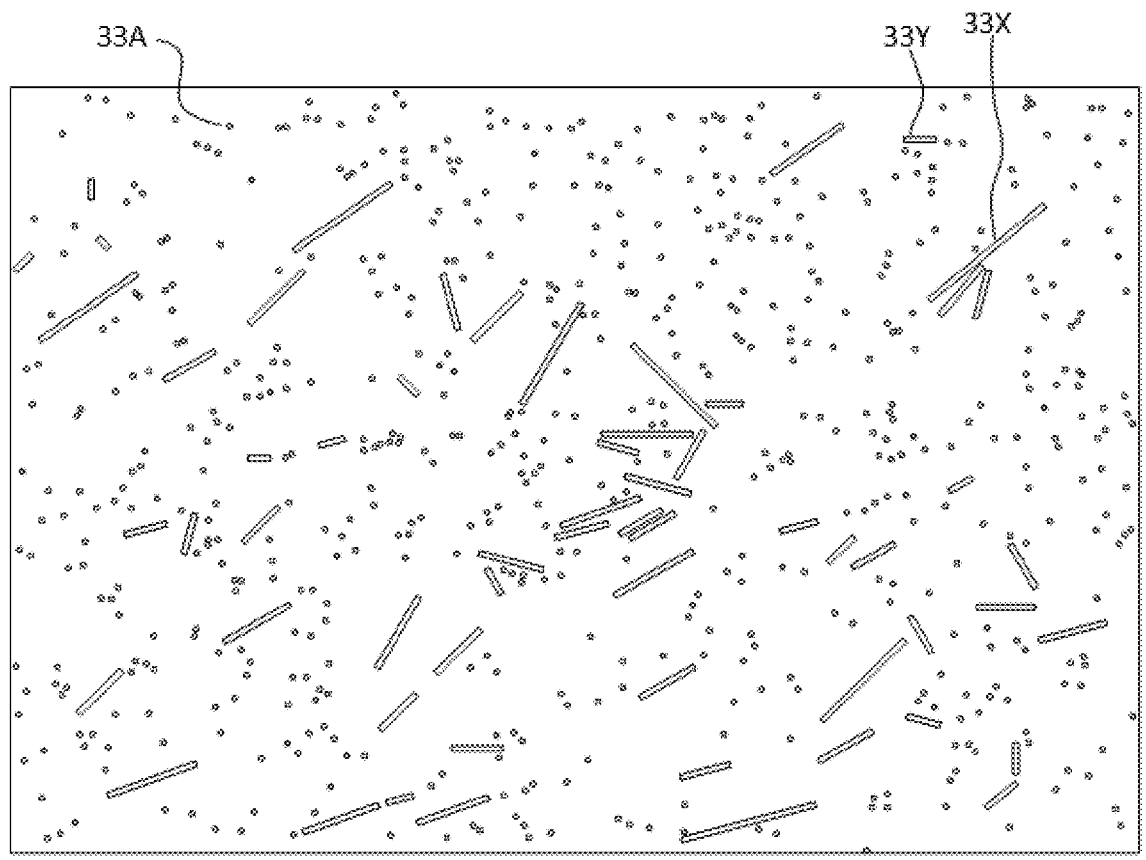
FIG. 4 is a diagram schematically showing an observation image obtained by observing a surface of a thermally conductive sheet of Example 1 with an optical microscope.

FIG. 4 shows a schematic diagram of an image obtained by observing the surface of the thermally conductive sheet obtained in Example 1 with an optical microscope. With the optical microscope, the carbon fiber which lies down along the vicinity of the surface is observed in a length equal to that of the actual fiber length, and is observed in a length shorter than that of the actual fiber length as the degree of inclination with respect to the surface becomes larger. As shown in FIG. 4, among the carbon fibers 33 on the surface of the thermally conductive sheet, there were many carbon fibers 33A which were oriented in the thickness direction and substantially only the end surfaces of the fibers were seen, but some parts of the carbon fibers were carbon fibers 33X which were disposed in such a way as to lie down along the surface or carbon fibers 33Y which inclined with respect to the surface, and therefore were disposed in such a way as to fall down. With respect to these carbon fibers 33, only the linear carbon fibers are shown in the figure, but of course, a carbon fiber which is somewhat bent does not matter. Evaluation results are shown in Table 1.

Example 2

A thermally conductive sheet such that the graphitized carbon fiber is not exposed on the surface was obtained in the same manner as in Example 1, except that the intensity of the vibration which was added to the laminated body was made stronger than in Example 1 to set the intensity of the vibration to "Weak". Each surface of the thermally conductive sheet had adhesiveness. Evaluation results are shown in Table 1.

Example 3

A thermally conductive sheet such that the graphitized carbon fiber is not exposed on the surface was obtained in the same manner as in Example 1, except that the intensity of the vibration which was added to the laminated body was made stronger than in Example 2 to set the intensity of the vibration to "Middle". Each surface of the thermally conductive sheet had adhesiveness. Evaluation results are shown in Table 1.

Example 4

A thermally conductive sheet such that the graphitized carbon fiber is not exposed on the surface was obtained in the same manner as in Example 1, except that the intensity of the vibration which was added to the laminated body was made stronger than in Example 3 to set the intensity of the vibration to "Strong". Each surface of the thermally conductive sheet had adhesiveness. Evaluation results are shown in Table 1.

Example 5

A thermally conductive sheet such that the graphitized carbon fiber is not exposed on the surface was obtained in the same manner as in Example 1, except that the intensity of the vibration which was added to the laminated body was made stronger than in Example 4 to set the intensity of the vibration to "Super Strong". Each surface of the thermally conductive sheet had adhesiveness. Evaluation results are shown in Table 1.

Example 6

A thermally conductive sheet such that the graphitized carbon fiber is not exposed on the surface was obtained in the same manner as in Example 1, except that the vibration was not added to the laminated body. Each surface of the thermally conductive sheet had adhesiveness. Evaluation results are shown in Table 1.

Comparative Example 1

A thermally conductive sheet such that the graphitized carbon fiber is not exposed on the surface was obtained in the same manner as in Example 1, except that the magnetic field was not applied to the laminated body, and the vibration was not added to the laminated body. Evaluation results are shown in Table 1.

TABLE 1

|  |  | Example 1 | Example 2 | Example 3 | Example 4 | Example 5 | Example 6 | Comparative Example 1 |
|---|---|---|---|---|---|---|---|---|
| Production condition | Magnetic field Vibration | Applied Ultra-weak vibration | Applied Weak vibration | Applied Moderate-strength vibration | Applied Strong vibration | Applied Ultra-strong vibration | Applied Not added | Not applied Not added |
| Anisotropic filler | Proportion of anisotropic filler which is disposed in such a way as to fall down (%) | 22.3 | 8.3 | 6.2 | 5.5 | 2.5 | 36.5 | 50.6 |

TABLE 1-continued

| | | Example 1 | Example 2 | Example 3 | Example 4 | Example 5 | Example 6 | Comparative Example 1 |
|---|---|---|---|---|---|---|---|---|
| Thermal properties | Thermal resistance °C./W (when compressed by 10%) | 2.28 | 2.02 | 1.87 | 1.57 | 1.45 | 2.65 | 6.72 |
| | Thermal conductive property (W/m·K) | 9.12 | 10.95 | 11.9 | 13.1 | 13.7 | 7.8 | 2.68 |
| Tack property (ball tack test) | | 5 | 5 | 5 | 5 | 5 | 5 | 5 |

As is clear from the results of the Examples, when the anisotropic filler is disposed in such a way as to fall down in a predetermined proportion in the vicinity of the surface in the thermally conductive sheet, a desired thermal resistance value and a desired thermal conductivity can thereby be obtained, so that the thermal conductive properties in the thickness direction can be improved. On the other hand, as shown in the Comparative Example, when the amount of the anisotropic filler which is disposed in such a way as to fall down is large, a desired thermal resistance value and a desired thermal conductivity cannot be obtained, so that the thermal conductive properties in the thickness direction cannot be improved sufficiently.

REFERENCE SIGNS LIST 10, 20 Thermally conductive sheet
10A, 10B, 20A, 20B Surface
12 Polymer matrix
13A End surface
13B Outer peripheral surface
13, 13X, 13Y Anisotropic filler
14 Non-anisotropic filler
21 Thermal insulator
22 Lower copper block
23 Upper copper block
24 Heater
25 Heat sink
26 Load cell
S Test piece
$\theta_{j0}$ Temperature of upper copper block
$\theta_{j1}$ Temperature of lower copper block

The invention claimed is:

1. A thermally conductive sheet comprising:
a polymer matrix; and
an anisotropic filler,
wherein a first portion of the anisotropic filler is oriented in a thickness direction,
wherein a second portion of the anisotropic filler is disposed in such a way as to lie down near a surface of the thermally conductive sheet, the surface being observed with an optical microscope,
wherein the second portion of the anisotropic filler is 1 to 45% of a total number of the anisotropic fillers observed in an observation image observed with the optical microscope, and
wherein a proportion of the anisotropic filler which is disposed in such a way as to lie down near the surface is larger than a proportion of the anisotropic filler which is disposed in such a way as to lie down inside the thermally conductive sheet.

2. The thermally conductive sheet according to claim 1, wherein the anisotropic filler is not exposed on the surface of the thermally conductive sheet.

3. The thermally conductive sheet according to claim 1, wherein the anisotropic filler is a fiber material.

4. The thermally conductive sheet according to claim 3, wherein the fiber material is a carbon fiber.

5. The thermally conductive sheet according to claim 4, wherein the carbon fiber is covered with an insulating layer.

6. The thermally conductive sheet according to claim 5, wherein the insulating layer comprises silicon dioxide.

7. The thermally conductive sheet according to claim 3, wherein the fiber material has an average fiber length of 50 to 500 µm.

8. The thermally conductive sheet according to claim 1, further comprising a non-anisotropic filler.

9. The thermally conductive sheet according to claim 8, wherein the non-anisotropic filler is at least one selected from the group consisting of alumina, aluminum, zinc oxide, boron nitride, and aluminum nitride.

10. The thermally conductive sheet according to claim 8, wherein a ratio of a volume filling ratio of the non-anisotropic filler to a volume filling ratio of the anisotropic filler is 2 to 5.

11. The thermally conductive sheet according to claim 1, wherein at least part of the anisotropic filler which is disposed in such a way as to fall down on the surface is disposed in such a way as to incline with respect to the surface.

12. The thermally conductive sheet according to claim 1, wherein the polymer matrix is addition reaction-curable type-silicone.

13. The thermally conductive sheet according to claim 1, wherein the thermally conductive sheet has a thickness of 0.1 to 5 mm.

14. The thermally conductive sheet according to claim 1, wherein the thermally conductive sheet has a thermal conductivity in a thickness direction of 6 w/m·K or more.

* * * * *